(12) United States Patent
DelaRosa et al.

(10) Patent No.: US 6,527,855 B2
(45) Date of Patent: Mar. 4, 2003

(54) ATOMIC LAYER DEPOSITION OF COBALT FROM COBALT METALLORGANIC COMPOUNDS

(75) Inventors: Mark J. DelaRosa, Chandler, AZ (US); Toh-Ming Lu, Loudonville, CA (US); Atul Kumar, Fremont, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/974,178

(22) Filed: Oct. 10, 2001

(65) Prior Publication Data
US 2002/0081381 A1 Jun. 27, 2002

Related U.S. Application Data
(60) Provisional application No. 60/238,630, filed on Oct. 10, 2000.

(51) Int. Cl.$^7$ .............................. C30B 25/00
(52) U.S. Cl. .............. 117/89; 117/88; 117/93; 117/102; 117/104; 117/105
(58) Field of Search .............. 117/88, 89, 93, 117/99, 102, 104, 105

(56) References Cited

U.S. PATENT DOCUMENTS 6,124,158 A  *  9/2000  Dautartas et al. ........... 438/216

* cited by examiner

Primary Examiner—Felisa Hiteshew
(74) Attorney, Agent, or Firm—Heslin Rothenberg Farley & Mesiti P.C.; Mary Louise Gioeni, Esq.

(57) ABSTRACT

Cobalt thin films were prepared by atomic layer deposition (ALD). The precursor cobalt(II) acetylacetonate [Co$(C_5H_7O_2)_2$] was used to selectively deposit films onto iridium substrates using hydrogen reduction. Cobalt growth was observed on $SiO_2$, silicon, fluorinated silica glass (FSG), and tantalum when silane was used as a reducing agent.

27 Claims, 1 Drawing Sheet

ATOMIC LAYER DEPOSITION OF COBALT FROM COBALT METALLORGANIC COMPOUNDS

CROSS-REFERENCE TO RELATED APPLICATIONS

This application claims priority from U.S. Provisional Application Ser. No. 60/238,630, filed on Oct. 10, 2000.

FIELD OF THE INVENTION

The invention relates to atomic layer deposition processes.

BACKGROUND OF THE INVENTION

Atomic layer deposition (ALD) is an ideal technique for fabricating thin layers requiring precision-controlled nanoscale film thickness. It is a type of chemical vapor deposition (CVD), wherein a film is built up through deposition of multiple ultra thin layers of atomic level controllability, with the thickness of the ultimate film being determined by the number of layers deposited. The source precursor is-adsorbed in a self-limiting process on the substrate surface, followed by decomposition of this precursor to form a single molecular layer of the desired material. Decomposition may occur through reaction with an appropriately selected reagent. Thicker films are produced through repeated growth cycles until the target thickness is achieved. In an ALD process, a substrate with at least one surface to be coated, a source precursor, and any reactant(s), necessary for forming a desired product, and which is capable of reacting with the precursor to form a desired product on the substrate surface, such as a film, liner, layer or other material, are introduced into a deposition chamber. The precursor and reactant(s), both of which are typically in vapor or gaseous form, are pulsed sequentially into the deposition chamber with inert gas pulses in between the precursor and reactant pulses, for a specified, typically predetermined, short period of time, and allowed to react on the substrate surface to form an atomic layer of the desired thickness, typically on the scale of an atomic monolayer.

In practice, the reactant gases are alternately pulsed into the reactor, separated by an inert gas flush. The characteristic feature of ALD is that each reactant is delivered to the substrate until a saturated surface condition is reached. To obtain a self-limiting growth, it is necessary that sufficient reactant reach the substrate, and also that only a monolayer remain after the inert purge. As the growth rate is self-limiting, the rate of growth is proportional to the repetition rate of the reaction sequences rather than to the flux of reactant, as in CVD.

Cobalt-containing alloys are of interest for giant magnetoresistance (GMR) applications. Cobalt is also deposited onto silicon gate contacts in integrated circuits to form cobalt silicide upon annealing. Deposition of cobalt is typically via sputtering, and CVD routes have also been explored. For example, Charles et al., have investigated the metallorganic chemical vapor deposition (MOCVD) of cobalt using bis(acetylacetonate) cobalt(II), or Co(acac)$_2$, in the temperature range 240–510° C. (*J. Inorg. Nucl. Chem.* p. 995 (1969)). Gu et al. have disclosed use of the same precursor for the MOCVD fabrications of Cu-Co alloys at room temperatures from 250–310° C. (*Thin Solid Films*, 340, p. 45 (1999)).

SUMMARY OF THE INVENTION

It has been unexpectedly discovered that a metallic layer may be deposited by an ALD process from a metallorganic precursor, on a noble or semi-noble metal substrate, using hydrogen as a reducing agent. The metal of the deposited layer may be Fe, Ru, Co, Rh, Ir, Ni, Pd, Pt, Ag, or Au. In one embodiment, the precursor is Co(acac)$_2$.

In another aspect, the invention relates to an atomic layer deposition process which includes depositing a metallic layer on a metal nitride or metal oxide substrate, using an oxidizing agent and hydrogen as a reducing agent. The precursor, reducing agent and oxidizing agent are sequentially pulsed into a reaction chamber containing the substrate, and a purge gas is pulsed into the reaction chamber between each sequential pulse. The metal of the deposited layer may be Fe, Ru, Co, Rh, Ir, Ni, Pd, Pt, Cu, Ag, or Au. In one embodiment, the precursor compound includes a bidentate ligand, for example, a β-diketonate.

In yet another aspect, the invention relates to an atomic layer deposition process which includes depositing, on a substrate, a metallic layer from a metallorganic precursor, using a hydride as a reducing agent. The reducing agent may be, for example, silane. The metal of the deposited layer may be Fe, Ru, Co, Rh, Ir, Ni, Pd, Pt, Cu, Ag, or Au. In one embodiment, the precursor compound includes a bidentate ligand, for example, a β-diketonate. The substrate may have a hydroxyl terminated surface; examples of such substrates include tantalum, silicon, silicon dioxide and fluorinated silica glass.

DETAILED DESCRIPTION OF THE INVENTION

Figure 1:
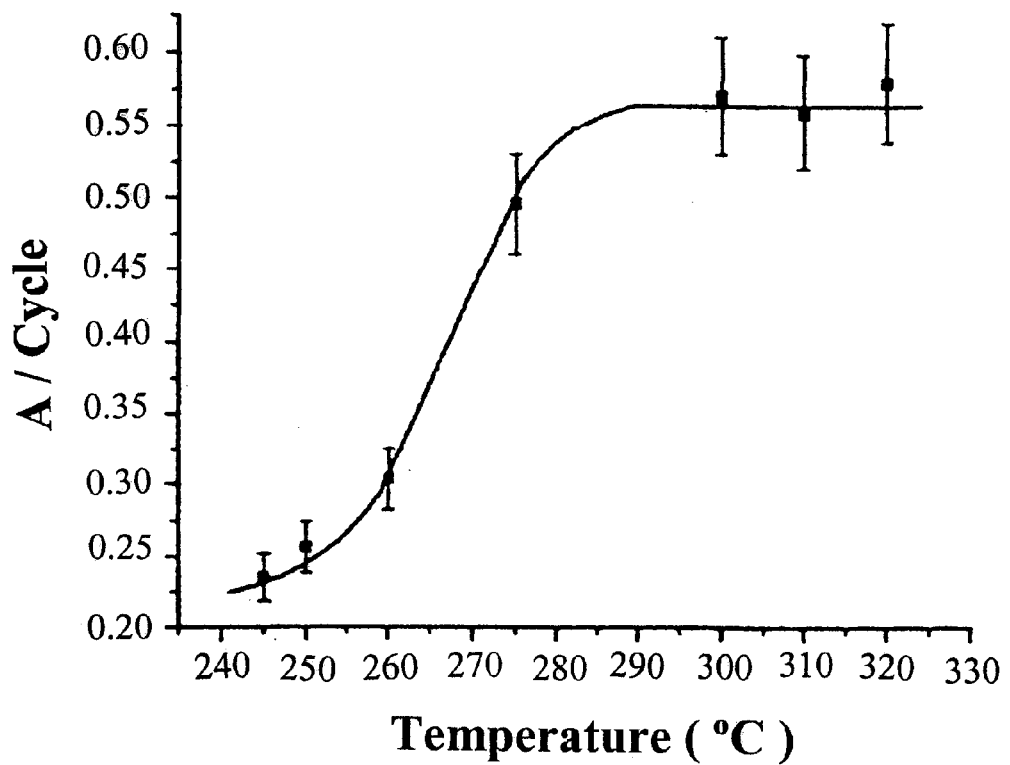
FIG. 1 is a graph showing temperature dependency of the rate of cobalt deposition on an iridium substrate, using Co(acac)$_2$ as the precursor.

In one embodiment, the present invention relates to an atomic layer deposition process comprising depositing a layer from a metallorganic precursor on a noble or semi-noble metal substrate, using a hydrogen reducing agent. The metal deposited may be iron, ruthenium, cobalt, rhenium, iridium, nickel, palladium, platinum, silver or gold; in particular, the metal may be cobalt, iridium, nickel, palladium, or platinum. The precursor for the metal should not be one which decomposes by thermolysis at or below the deposition temperature, but should react with the hydrogen reducing agent to produce the metal.

The metallorganic precursor is composed of the metal and one or more ligands. The ligand may be any bidentate ligand; a class of bidentate ligands particularly suitable for use in the present invention is represented by the formula $R^1$—CX—CH2—CY—$R^2$, wherein $R^1$ and $R^2$ are independently alkyl, haloalkyl, alkoxy, aryl, silyl, or alkyl-, nitro-, halo-, or silyl-substituted alkyl or aryl; X and Y are independently O, S, or N. In particular, the ligand may be a monothio-β-ketone, a dithio-β-ketone, an aminoketone, or a silyl-β-diketone, and more particularly, a β-diketonate. Specific examples of these ligands include acetylacetonate (acac), 2,2,6,6-tetramethyl-3,5-heptanedione (thd) 2,2,7-trimethyl-3,5-octanedionate (tmod), and 2,2,6,6-tetramethyl-3,5-heptanedionate (tmhd), and fluorinated, β-diketonates, such as 1,1,1-trifluoro-2,4-pentanedionate (tfac), 1,1,1-trifluoro-5,5-dimethyl-2,4-pentanedionate (tfh) and 1,1,1,2,2,3,3,7,7,8,8,9,9,9-tetradecafluoro-4,6-nonanedionate (tdf) 1,1,1,5,5,5-hexafluoro-2,4-pentanedione (hfa or hfac) and 2,2-diethyl-6,6,7,7,8,8,8-heptafluoro-3,5-octanedione (fod). Source precursors for use in any of the embodiments of the present invention should not decompose by thermolysis. An example of a suitable precursor for deposition of cobalt is Co(acac)$_2$.

If desired, a process comprising depositing a layer from a metallorganic precursor on a noble or semi-noble metal substrate, using a hydrogen reducing agent, may additionally include using an oxidizing agent. The oxidizing agent may be selected from oxygen, water and alcohols.

The ALD processes according to the present invention are typically performed by sequentially pulsing a precursor vapor or gas, a reducing agent gas, and, where desired or necessary, an oxidizing agent gas, into a deposition or reaction chamber of an ALD reactor containing the substrate to be coated. An inert purge gas is pulsed into the reaction chamber between each pulse of the precursor vapor, the reducing agent gas and the oxidizing agent gas. Thus, one cycle of the process is as follows:

pulsing a precursor vapor, if desired, with a carrier gas into the deposition chamber containing the substrate;

purging the chamber using inert purged gas;

pulsing the reducing agent gas into the chamber; and purging the chamber, again using the same or a different inert purged gas.

If desired, an oxidizing agent may then be pulsed into the chamber, followed by a pulse of an inert purged gas. The cycle is repeated until a desired film thickness is produced. Multilayer films where very thin layers, on the order of monolayers, have different compositions, may be formed by using one or more different precursor vapors, and/or reactant gases in the appropriate steps. Alloy layers may be formed Gil by mixing more than one precursor and/or more than one reactant gas in a single step. Films initially formed as multilayer films may result in alloy films where individual layers blend with adjacent layers under deposition conditions. Multilayer films may be converted to alloy films by annealing.

Duration of the various pulses in the cycle is not critical, and typically ranges from about 0.1 seconds to about 5 seconds. Some factors affecting pulse length include reactor pressure, substrate temperature, reaction rate, and reactivity of the precursor, reducing agent and, where used, oxidizing agent. The length of the purging pulse is typically sufficiently long to ensure removal of all remaining non-inert gases from the reaction chamber. Inert gases useful as carrier gases or as purge gases include, for example, helium, argon, nitrogen, xenon, and krypton.

Deposition temperature typically depends on the precursor and reducing agent used. Temperature of the substrate may be high enough to allow adsorption of the precursor species, but low enough to prevent thermal decomposition. Temperatures typically used range from about 200° C. to about 400° C. The deposition is typically carried out under reduced pressure, for example, pressure ranging from 0.1 to 10 torr.

In another embodiment, an atomic layer deposition process according to the present invention comprises depositing a layer comprising a metal selected from the group consisting of Fe, Ru, Co, Rh, Ir, Ni, Pd, Pt, Cu, Ag, and Au from a precursor comprising metallorganic compound on a substrate comprising at least one metal nitride or at least one metal oxide using a reducing agent comprising hydrogen and an oxidizing agent. The precursor, reducing agent and, oxidizing agent are sequentially pulsed into a reaction chamber containing the substrate, and at least one purge gas is pulsed into the reaction chamber between each sequential pulse. The oxidizing agent may be oxygen, water or a mixture of one or more alcohols.

As noted above, the precursor should not decompose by thermolysis at a temperature less than or equal to the deposition temperature. For example, Cu(I)(hfac) decomposes at typical deposition temperatures without the aid of a reducing agent and, therefore is not suitable for use in this embodiment of the process of the present invention. In contrast, Cu(II)(hfac)$_2$ does not decompose unless hydrogen is supplied as a reducing agent at those temperatures, and is, therefore, suitable for use. Ligands suitable for use in the precursors are the same as those described above.

In another embodiment, an atomic layer deposition process according to the present invention comprises depositing on a substrate a layer comprising a metal selected from the group consisting of Fe, Ru, Co, Rh, Ir, Ni, Pd, Pt, Cu, Ag, and Au from a precursor comprising at least one metallorganic compound using a reducing agent comprising a hydride. In particular, the reducing agent may be silane. Ligands suitable for use in the precursors are the same as those described above. A substrate for the deposition in this embodiment may be any suitable substrate, but, in particular, may be tantalum, silicon, silicon dioxide or fluorinated silica glass. If desired, an oxidizing agent may be utilized, particularly oxygen, water or a mixture of one or more alcohols.

EXAMPLES

Example 1

Cobalt on Noble Metal

Cobalt films were grown in a warm-walled, cylindrical reactor having an inlet laminar flow expansion zone and a 75 mm diameter resistively heated substrate platen. The substrates used for this investigation were 1×2 cm <100> p-type Si coated with either 200 Å of evaporated iridium, 1000 Å of sputtered tantalum, or 1000 Å of thermal oxide, in addition to uncoated Si. The uncoated Si substrates were RCA cleaned and given a dilute HF (10:1) dip and DI rinse immediately prior to loading into the reactor. The coated samples were blow clean with high purity nitrogen or argon prior to loading in the reactor. High purity argon (Air Products UHP grade) was used as the carrier gas for the precursor. The hydrogen gas was 20% in argon. Co(acac)$_2$ was used as the precursor; it was purchased as the hydrate from Strem Chemicals and purified by sublimation of 140° C. under vacuum, changing from a flesh-color (hydrate) to purple. The compound remained purple upon exposure to air, even after several days. The typical precursor charge was 1–2 g, depending on the run time. A fresh charge was loaded for each run. An MKS mass flow controller was used to control the carrier gas flowing over the precursor and into the reactor. The purge gas and reactant gases were also metered using MKS mass flow controllers. The pulsing of the gases was regulated by computer controlled pneumatic valves. Each reactant and purge pulse was 5 seconds, and followed by a 5 second pump down step. The pulse durations were not optimized in the present study. The chamber pressure during each pulse was 1.7–2 torr, and less than 5 mtorr at the end of each pump down step.

The lines between the sublimator and the reactor were heated to 190° C., and the reactor wall was heated to 165° C. to prevent precursor condensation. Inspection of the lines and reactor wall between each run revealed neither condensation nor decomposition of the precursor. The substrate temperature was monitored with a k-type thermocouple contacting the sample. A series of runs was performed spanning the temperature range of 245–325° C. to determine the growth rate of ALD cobalt. Film thickness was determined using Rutherford Backscattering Spectometry (RBS) conducted on a 4.5 MeV Dynamitron linear accelerator. RBS spectra were taken using 2 MeV He$^+$ beam. The areal density of the films was determined by integrating the area under the signal peak. Using the bulk density of cobalt and assuming uniform film coverage, the average thickness was calculated.

Film growth was found to be selective, with deposition only occurring on the iridium coated substrate. No growth was measured on the Ta, Si, or $SiO_2$ using this precursor and hydrogen. This strongly indicated that the film growth was ALD rather than MOCVD, as the precursor used is known to deposit MOCVD cobalt on quartz under the deposition conditions studied. The deposition thickness per cycle versus temperature on iridium is shown in FIG. 1. The plot reveals two distinct deposition characteristics. Self-limiting growth began near 280° C. This is the region where optimal surface saturation of the precursor occurs, along with efficient reduction. This regime extended at least to 325° C., the upper temperature limit of our study. The deposition rate was approximately 0.57 Å/cycle. Below 280° C., the growth per cycle dropped dramatically as the deposition temperature decreased. The depressed deposition rate at lower temperatures is thought to be caused by slower kinetics during the reduction step.

To further verify the growth was self-limiting as required for ALD, experiments were conducted using iridium coated substrates heated to 300° C., while the precursor temperature was varied from 145 to 165° C. MOCVD cobalt deposited in this temperature range would show an increase in growth rate at higher precursor temperatures due to increased precursor transport under mass-transport limited growth conditions. In our study, the deposition rate was constant within experimental error.

EXAMPLE 2

Cobalt on Hydroxyl Terminated Substrates

In order to achieve cobalt film growth on hydroxyl terminated substrates, we explored the substitution of hydrogen with 0.5% silane (in argon) as a reducing agent. Using silane, we were able to deposit thin cobalt films on tantalum, silicon, SiO2, and fluorinated silica glass (FSG). The growth rate was depressed, with a maximum growth rate of 0.38 Å/cycle.

What is claimed is:

1. An atomic layer deposition process comprising depositing
   a layer comprising a metal selected from the group consisting of Fe, Ru, Co, Rh, Ir, Ni, Pd, Pt, Ag, and Au
   from a precursor comprising at least one metallorganic compound on a substrate comprising at least one noble or semi-noble metal using a reducing agent comprising hydrogen; and
   with the proviso that the precursor does not decompose by thermolysis at a temperature less than or equal to a deposition temperature.

2. An atomic layer deposition process according to claim 1, wherein the deposited layer comprises a metal selected from the group consisting of Co, Ir, Ni, Pd, and Pt.

3. An atomic layer deposition process according to claim 1, wherein the precursor comprises a bidentate ligand.

4. An atomic layer deposition process according to claim 1, wherein the precursor is selected from the group consisting of β-diketonates, monothio-β-ketonates, dithio-β-ketonates, aminoketonates, and silyl-β-diketonates.

5. An atomic layer deposition process according to claim 1, wherein the precursor comprises a β-diketonate.

6. An atomic layer deposition process according to claim 5, wherein the deposited layer comprises cobalt, and the precursor comprises $Co(acac)_2$.

7. An atomic layer deposition process according to claim 1, wherein the substrate comprises iridium.

8. An atomic layer deposition process according to claim 1, additionally comprising using an oxidizing agent.

9. An atomic layer deposition process according to claim 8, wherein the oxidizing agent is selected from oxygen, water and alcohols.

10. An atomic layer deposition process according to claim 1, wherein the precursor, reducing agent and, optionally, an oxidizing agent are sequentially pulsed into a reaction chamber containing the substrate, and at least one purge gas is pulsed into the reaction chamber between each sequential pulse.

11. An atomic layer deposition process comprising depositing
    a layer comprising a metal selected from the group consisting of Fe, Ru, Co, Rh, Ir, Ni, Pd, Pt, Cu, Ag, and Au
    from a precursor comprising at least one metallorganic compound on a substrate comprising at least one metal nitride or at least one metal oxide
    using an oxidizing agent, and a reducing agent comprising hydrogen;
    wherein the precursor, reducing agent and oxidizing agent are sequentially pulsed into a reaction chamber containing the substrate, and at least one purge gas is pulsed into the reaction chamber between each sequential pulse; and;
    with the proviso that the precursor does not decompose by thermolysis at a temperature less than or equal to a deposition temperature.

12. An atomic layer deposition process according to claim 11, wherein the deposited layer comprises a metal selected from the group consisting of Co, Ir, Ni, Pd, Pt, and Cu.

13. An atomic layer deposition process according to claim 11, wherein the precursor comprises a bidentate ligand.

14. An atomic layer deposition process according to claim 11, wherein the precursor is selected from the group consisting of β-diketonates, monothio-β-ketonates, dithio-β-ketonates, aminoketonates, and silyl-β-diketonates.

15. An atomic layer deposition process according to claim 11, wherein the precursor comprises a β-diketonate.

16. An atomic layer deposition process according to claim 11, wherein the oxidizing agent is selected from oxygen, water and alcohols.

17. An atomic layer deposition process comprising depositing, on a substrate,
    a layer comprising a metal selected from the group consisting of Fe, Ru, Co, Rh, Ir, Ni, Pd, Pt, Cu, Ag, and Au
    from a precursor comprising at least one metallorganic compound using a reducing agent comprising a hydride.

18. An atomic layer deposition process according to claim 17, wherein the reducing agent comprises silane.

19. An atomic layer deposition process according to claim 17, wherein the deposited layer comprises a metal selected from the group consisting of Co, Ir, Ni, Pd, Pt, and Cu.

20. An atomic layer deposition process according to claim 17, wherein the precursor comprises a bidentate ligand.

21. An atomic layer deposition process according to claim 17, wherein the precursor is selected from the group consisting of β-diketonates, monothio-β-ketonates, dithio-β-ketonates, aminoketonates, and silyl-β-diketonates.

22. An atomic layer deposition process according to claim 17, wherein the precursor comprises a β-diketonate.

23. An atomic layer deposition process according to claim 17, wherein the substrate is selected from tantalum, silicon, silicon dioxide and fluorinated silica glass.

24. An atomic layer deposition process according to claim 23, wherein the deposited layer comprises cobalt, and the precursor comprises $Co(acac)_2$.

25. An atomic layer deposition process according to claim 17, additionally comprising using an oxidizing agent.

26. An atomic layer deposition process according to claim 25, wherein the oxidizing agent is selected from oxygen, water and alcohols.

27. An atomic layer deposition process according to claim 17, wherein the precursor, reducing agent and, optionally, an oxidizing agent are sequentially pulsed into a reaction chamber containing the substrate, and at least one purge gas is pulsed into the reaction chamber between each sequential pulse.

* * * * *